(12) United States Patent
Kurita et al.

(10) Patent No.: US 8,436,655 B2
(45) Date of Patent: May 7, 2013

(54) VOLTAGE LEVEL SHIFT CIRCUIT AND SEMICONDUCTOR DEVICE

(75) Inventors: Kouhei Kurita, Tokyo (JP); Kanji Oishi, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 13/152,737

(22) Filed: Jun. 3, 2011

(65) Prior Publication Data

US 2011/0298493 A1    Dec. 8, 2011

(30) Foreign Application Priority Data

Jun. 4, 2010    (JP) ................. 2010-129118

(51) Int. Cl.
*H03K 19/0175* (2006.01)
(52) U.S. Cl.
USPC .............. 326/68; 326/63; 326/80; 326/81
(58) Field of Classification Search .............. 326/62–63, 326/68, 80–87; 327/333
See application file for complete search history.

(56) References Cited

U.S. PATENT DOCUMENTS

| 2005/0017783 A1* | 1/2005 | Lee et al. ............ 327/333 |
| 2007/0139093 A1* | 6/2007 | Lee et al. ............ 327/333 |
| 2007/0146043 A1* | 6/2007 | Lee et al. ............ 327/333 |

FOREIGN PATENT DOCUMENTS

JP    2000-163960 A    6/2000

* cited by examiner

*Primary Examiner* — Jany Tran
(74) *Attorney, Agent, or Firm* — Sughrue Mion, PLLC

(57) ABSTRACT

A voltage level shift circuit in which a difference in response characteristic depending on the signal level of an input signal is suppressed. The voltage level shift circuit generates an output signal VOUT having a voltage amplitude different from that of the input signal. An inverter INV2 generates a voltage V1 in the range of VSS to VDDI according to the input signal. An inverter INV3 generates a voltage V2 in the range of VSS to VPERI according to the input signal. An inverter INV4 generates the output signal VOUT according to V1 and V2.

10 Claims, 4 Drawing Sheets

VOLTAGE LEVEL SHIFT CIRCUIT AND SEMICONDUCTOR DEVICE

BACKGROUND OF THE INVENTION

1. Field of the Invention

The present invention relates to a voltage level shift circuit and a semiconductor device using the same. In particular, the present invention relates to a voltage level shift circuit in which the transition rate of an output signal when an input signal changes from one logic level to another logic level and that of the output signal when the input signal changes from the another logic level to the one logic level are made uniform, and a semiconductor device using the same.

2. Description of Related Art

Semiconductor devices such as a DRAM (Dynamic Random Access Memory) are supplied with a power supply potential VDD and a ground potential VSS (<VDD). The potential difference (voltage) between the power supply potential VDD and the ground potential VSS supplied to a semiconductor device is sometimes referred to as an external voltage VDD. The external voltage VDD becomes a first voltage VDDI (VDDI>VSS) in the semiconductor device. A second voltage VPERI is generated from the first voltage VDDI (VDDI>VPERI). Here, the first voltage VDDI refers to a potential difference between a power supply potential VDD and the ground potential VSS. The second voltage VPERI refers to a potential difference between a power supply potential VPERI and the ground potential VSS.

An input signal input to the semiconductor device from outside is converted into a signal in the range of the ground potential VSS to the power supply potential VDDI by an input signal discrimination unit. The signal is then converted into a signal in the range of the ground potential VSS to the power supply potential VPERI. Hereinafter, such a circuit that converts the voltage range of an input signal from VSS to VDDI into VSS to VPERI will be referred to as a "voltage level shift circuit." In many cases, the voltage conversion of the voltage level shift circuit is performed by making the operating voltage of an inverter on the input side different from that of an inverter. A conventional voltage level shift circuit is described in Japanese Patent Application Laid-Open No. 2000-163960.

In a typical voltage level shift circuit, the inverter on the input side is driven by the first voltage VDDI and the inverter on the output side is driven by the second voltage VPERI. The output of the inverter on the input side, i.e., the input signal to the inverter on the output side is a binary signal that becomes VDDI when the signal is HIGH, and VSS when the signal is LOW. Either one of a PMOS (Positive channel Metal Oxide Semiconductor) transistor and an NMOS (Negative channel Metal Oxide Semiconductor) transistor included in the inverter on the output side turns on depending on the logical value of the input signal.

When the input signal is HIGH (VDDI), the NMOS transistor turns on and the output signal level of the inverter on the output side becomes VSS. When the input signal is LOW (VSS), the PMOS transistor turns on and the signal level of the inverter on the output side becomes VPERI.

Such a voltage level shift circuit has had a problem that the transition rate (speed) of the output signal when the input signal changes from HIGH to LOW is different from that of the output signal when the input signal changes from LOW to HIGH. More specifically, suppose that the gate-source voltage of the PMOS transistor when the transistor is on is VGSP, and the gate-source voltage of the NMOS transistor when the transistor is on is VGSN. If the input signal=VDDI (HIGH), the gate-source voltage VGSN of the NMOS transistor which is on is VDDI−VSS. On the other hand, if the input signal=VSS (LOW), the gate-source voltage VGSP of the PMOS transistor which is on is VSS−VPERI. The two gate-source voltages do not coincide with each other.

In other words, VGSN at which the NMOS transistor turns on due to the input signal=VDDI (HIGH) in an absolute value is greater than that of VGSP at which the PMOS transistor turns ON due to the input signal=VSS (LOW). For example, assuming that VDDI=1.5 (V), VPERI=1.0 (V), and VSS=0.0 (V), the NMOS transistor turns on at VGSN=1.5 (V) and the PMOS transistor turns on at VGSP=−1.0 (V).

The different ON voltages of the PMOS transistor and the NMOS transistor give rise to a difference in the response characteristic of the voltage level shift circuit depending on the logic of the input signal.

SUMMARY

In one embodiment, there is provided a voltage level shift circuit that generates an output signal having a voltage amplitude different from that of an input signal. The circuit includes: a first signal generation unit that receives the input signal to generate a first signal having a first voltage amplitude; a second signal generation unit that receives the input signal to generate a second signal having a second voltage amplitude different from the first voltage amplitude; and a synthesis unit that receives the first and second signals to generate the output signal.

In another embodiment, there is provided a voltage level shift circuit that includes: an input signal discrimination unit that generates an input signal based on an external signal; first and second signal generation units that receive the input signal to generate first and second signals in the same logic, respectively; and a synthesis unit that receives the first and second signals to generate an output signal. The input signal discrimination unit and the first signal generation unit are connected to a first power supply line that supplies a first power supply potential. The second signal generation unit and the synthesis unit are connected to a second power supply line that supplies a second power supply potential different from the first power supply potential.

There is provided a semiconductor device that includes: the voltage level shift circuits described above and an internal circuit that is connected between the second and third power supply lines and operates with the output signal.

According to the present invention, it is easier to suppress variations in the response speed of the voltage level shift circuit depending on the signal level of the input signal.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENT

A representative example of the technical concept of the present invention for solving the problem will be described below. It will be understood by those skilled in the art that various modifications and alterations may be made within the scope of claims of the present invention, and such modifications and alterations are also embraced within the scope of claims of the present invention. The description of the specification and the drawings are therefore to be considered exemplary, not restrictive.

The technical concept of the present invention is to input respective signals having respective different voltage amplitude values, generated from a single input signal, to the PMOS transistor and the NMOS transistor that constitute the inverter on the output side of the voltage level shift circuit, so that the gate-source voltage of the PMOS transistor when the transistor is on coincides with that of the NMOS transistor when the transistor is on. This consequently makes it possible to make coincide the transition rate of the output signal when the input signal input to the voltage level shift circuit changes from one logic level to another logic level with that of the output signal when the input signal changes from the another logic level to the one logic level.

Preferred embodiments of the present invention will be explained below in detail with reference to the accompanying drawings.

Figure 1:
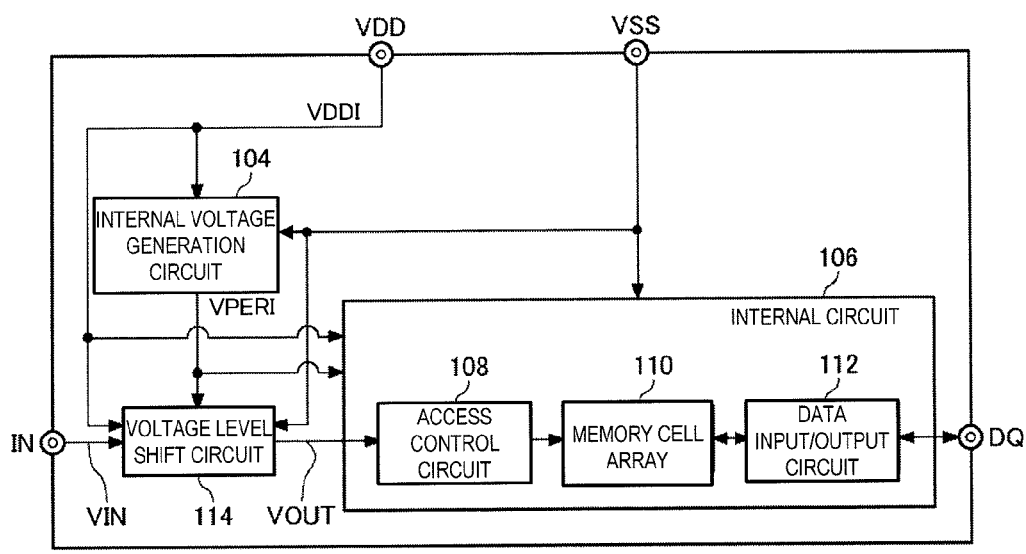
FIG. 1 is a functional block diagram of a semiconductor memory device.

FIG. 1 is a functional block diagram of a semiconductor memory device 100. The semiconductor memory device 100 according to the present embodiment is a SDRAM (Synchronous Dynamic Random Access Memory) of DDR (Double-Data-Rate) type. The semiconductor memory device 100 has a VDD terminal and a VSS terminal as power supply terminals, an IN terminal as a signal input terminal, and a DQ terminal as a data input/output terminal.

The semiconductor memory device 100 includes an internal voltage generation circuit 104, a voltage level shift circuit 114, and an internal circuit 106. An external potential VDD is supplied from the VDD terminal to the internal voltage generation circuit 104, the voltage level shift circuit 114, and the internal circuit 106 as an internal voltage VDDI. An external potential VSS is supplied from the VSS terminal to the internal voltage generation circuit 104, the voltage level shift circuit 114, and the internal circuit 106.

The internal voltage generation circuit 104 generates an internal potential VPERI based on VDDI and VSS, and supplies the internal potential VPERI to the voltage level shift circuit 114 and the internal circuit 106. For the sake of simplifying the following description, the present embodiment will be described with VDDI=1.5 (V), VPERI=1.0 (V), and VSS=0.0 (V).

Various types of input signals are supplied to the voltage level shift circuit 114 from the input terminal IN. The input signals are binary logic signals that express an address, clock, command, etc. The voltage level shift circuit 114 is a level-down shifter that converts an input signal VIN into a signal having a voltage amplitude of VSS to VDDI, and further converts the signal into one having a voltage amplitude of VSS to VPERI. The input signal VIN is converted into a signal VOUT in the range of VSS to VPERI, and supplied to each component of the internal circuit 106.

The internal circuit 106 includes an access control circuit 108, a memory cell array 110, and a data input/output circuit 112. The access control circuit 108 controls access to the memory cell array 110 according to the signal VOUT. The access control circuit 108 includes an address decoder, command decoder, control logic, etc. The data input/output circuit 112 controls data transmission between memory cells in the memory cell array 110, selected by the access control circuit 108, and the DQ terminal. The internal circuit 106 is supplied with VDDI, VPERI, and VSS, and operates on these power supplies.

Figure 2:
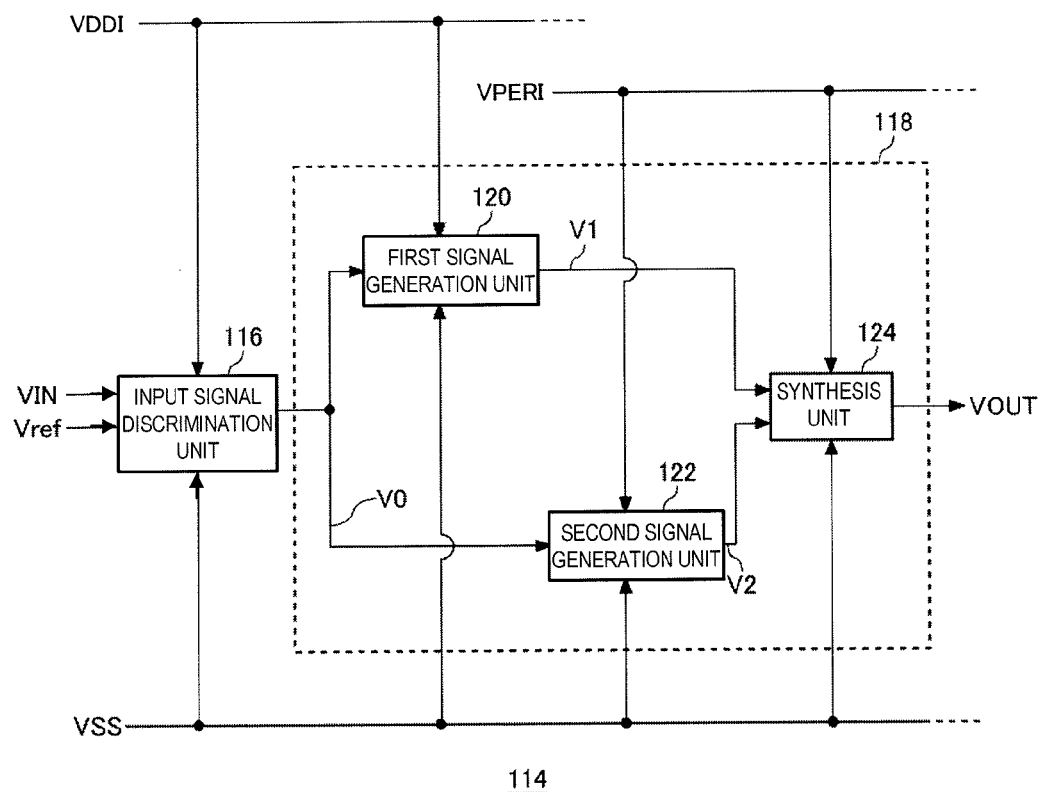
FIG. 2 is a functional block diagram of the voltage level shift circuit.

FIG. 2 is a functional block diagram of the voltage level shift circuit 114. The voltage level shift circuit 114 includes an input signal discrimination unit 116 and a signal output unit 118. The signal output unit 118 includes a first signal generation unit 120, a second signal generation unit 122, and a synthesis unit 124. The input signal discrimination unit 116 and the first signal generation unit 120 are driven based on the voltage between VDDI and VSS. The second signal generation unit 122 and the synthesis unit 124 are driven based on the voltage between VPERI and VSS.

The input signal discrimination unit 116 compares the input signal VIN with a reference voltage Vref to output a signal V0. The signal V0 becomes VSS (LOW) when VIN>Vref, and VDDI (HIGH) when VIN≦Vref. The signal V0 is supplied to the first signal generation unit 120 and the second signal generation unit 122. The input signal discrimination unit 116 will be detailed later in conjunction with FIG. 3. The first signal generation unit 120 generates a signal V1 in the range of VSS to VDDI. The second signal generation unit 122 generates a signal V2 in the range of VSS to VPERI. Based on the signals V1 and V2, the synthesis unit 124 generates the signal VOUT in the range of VSS to VPERI. The signal output unit 118 will be detailed later in conjunction with FIG. 4.

Figure 3:
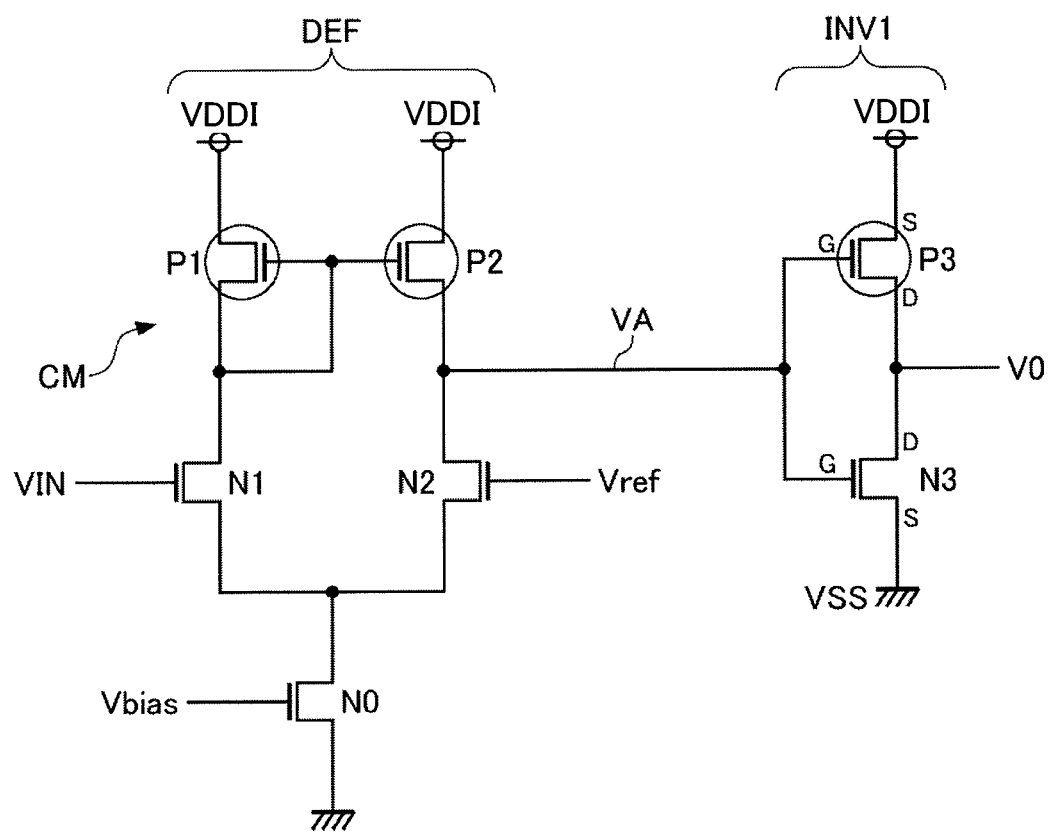
FIG. 3 is a circuit diagram of the input signal discrimination unit.

FIG. 3 is a circuit diagram of the input signal discrimination unit 116. The input signal discrimination unit 116 includes a differential circuit DEF and an inverter INV1. The differential circuit DEF includes a current mirror circuit CM which is composed of PMOS transistors P1 and P2, an NMOS transistors N1 and N2 as input transistors, and an NMOS transistor N0 as a current source. The differential circuit DEF compares the binary input signal VIN with the reference potential Vref. The comparison result is expressed by an output signal VA. If VIN>Vref, the output signal VA is at high level. If VIN<Vref, the output signal VA is at low level.

The inverter INV1 includes a PMOS transistor P3 and an NMOS transistor N3. The source of the PMOS transistor P3 is connected to VDDI. The source of the NMOS transistor N3 is connected to VSS. Consequently, when the signal VA is at high level, the NMOS transistor N3 turns on and the output signal V0 becomes VSS (LOW). When the signal VA is at low level, the PMOS transistor P3 turns on and the output signal V0 becomes VDDI (HIGH). As a result, the signal V0 changes in the range of VSS to VDDI.

Figure 4:
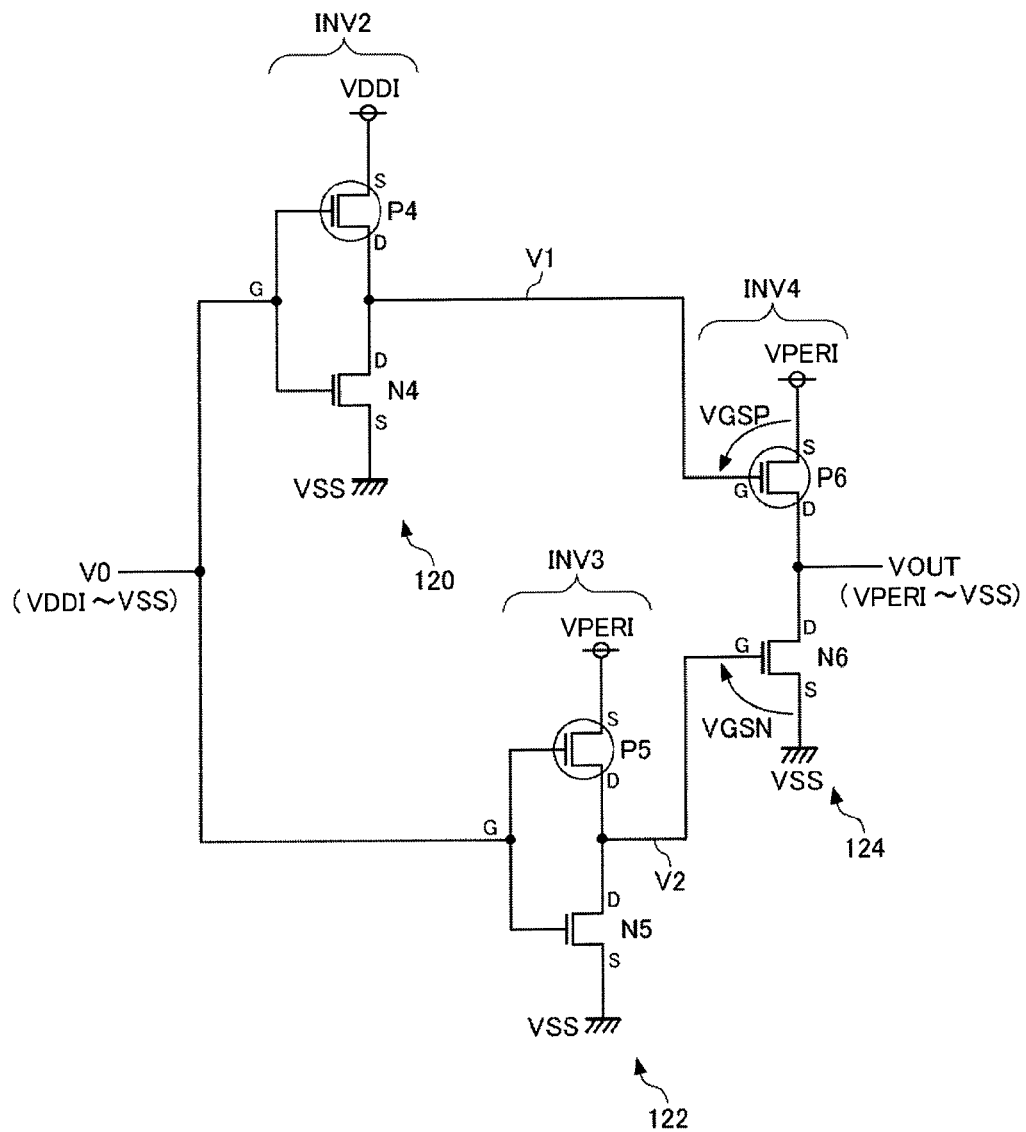
FIG. 4 is a circuit diagram of the signal output unit.

FIG. 4 is a circuit diagram of the signal output unit 118. In the present embodiment, the first signal generation unit 120, the second signal generation unit 122, and the synthesis unit 124 are configured as an inverter, respectively. An inverter INV2 corresponding to the first signal generation unit 120 is driven in the range of VSS to VDDI. An inverter INV3 corresponding to the second signal generation unit 122 and an inverter INV4 corresponding to the synthesis unit 124 are driven in the range of VSS to VPERI.

The inverter INV2 includes a PMOS transistor P4 and an NMOS transistor N4. The source of the PMOS transistor P4 is connected to VDDI (first power supply line) and the source of the NMOS transistor N4 is connected to VSS (third power supply line), whereby the signal V1 in the range of VSS to VDDI is output. The inverter INV3 includes a PMOS transistor P5 and an NMOS transistor N5. The source of the PMOS transistor P5 is connected to VPERI (second power supply line) and the source of the NMOS transistor N5 is connected to VSS (third power supply line), whereby the signal V2 in the range of VSS to VPERI is output. The signals V1 and V2 therefore always have the same logic level. The inverter INV4 includes a PMOS transistor P6 and an NMOS transistor N6. The source of the PMOS transistor P6 is connected to VPERI (second power supply line). The source of the NMOS transistor N6 is connected to VSS (third power supply line). The signal V1 is supplied to the gate of the PMOS transistor P6, the control electrode. The signal V2 is supplied to the gate of the NMOS transistor N6, the control electrode. The output signal VOUT is then taken out from the connecting point between the PMOS transistor P6 and the NMOS transistor N6, i.e., the common drain.

If the input signal V0=VDDI (HIGH), the NMOS transistors N4 and N5 turn on and the PMOS transistors P4 and P5 turn off. The result is V1=V2=VSS. The PMOS transistor P6 of the synthesis unit 124 turns on because VGSP=VSS−VPERI=−1.0 (V). The NMOS transistor N6 turns off because VGSN=VSS−VSS=0.0 (V). Consequently, the output signal VOUT of the inverter INV4 becomes VPERI (HIGH).

If the input signal V0=VSS (LOW), the PMOS transistors P4 and P5 turn on and the NMOS transistors N4 and N5 turn off. The result is V1=VDDI and V2=VPERI. The PMOS transistor P6 of the synthesis unit 124 turns off because VGSP=VDDI−VPERI=0.5 (V). The NMOS transistor N6 turns on because VGSN=VPERI−VSS=1.0 (V). Consequently, the output signal VOUT of the inverter INV4 becomes VSS (LOW).

As describe above, the gate-source voltage VGSP of the PMOS transistor P6 which turns on when V0=VDDI and the gate-source voltage VGSN of the NMOS transistor N6 which turns on when V0=VSS both are 1.0 (V).

If the NMOS transistor N6 and the PMOS transistor P6 are formed to have the same driving power, the signal output unit 118 has no difference in response speed depending on the voltage level of V0. In other words, it is possible to make exactly coincide the transition rate of the signal VOUT when the signal V0 changes from the high level to the low level with that of the signal VOUT when the signal V0 changes from the low level to the high level.

The technical concept of the present invention is applicable, for example, to an external signal input circuit or the like that converts a signal coming from a data signal transmission route or an external terminal of a memory or data processor into an internal signal. The circuit forms of the input signal discrimination unit 116, the first signal generation unit 120, the second signal generation unit 122, the synthesis unit 124, and the like, and circuits for generating other control signals are not limited to the circuit forms disclosed in the present embodiment.

The technical concept of the voltage level shift circuit of the present invention may be applied to various semiconductor devices. For example, the present invention may be applied to semiconductor products in general, including CPUs (Central Processing Units), MCUs (Micro Control Units), DSPs (Digital Signal Processors), ASICs (Application Specific Integrated Circuits), ASSPs (Application Specific Standard Circuits), and memories. Examples of the product types of the semiconductor devices to which the present invention is applicable include an SOC (System On Chip), MCP (Multi Chip Package), and POP (Package On Package). The present invention may be applied to semiconductor devices that have any of such product types and package types.

When the transistors are field effect transistors (FETs), various FETs are applicable, including MIS (Metal Insulator Semiconductor) and TFT (Thin Film Transistor) as well as MOS (Metal Oxide Semiconductor). The device may even include bipolar transistors.

The PMOS transistors are a representative example of the transistor of first conductivity type. The N-channel transistors or NMOS transistors are a representative example of the transistor of second conductivity type.

It is apparent that the present invention is not limited to the above embodiments, but may be modified and changed without departing from the scope and spirit of the invention.

What is claimed is:

1. A voltage level shift circuit comprising:
    a first signal generation unit that receives an input signal to generate a first signal having a first voltage amplitude;
    a second signal generation unit that receives the input signal to generate a second signal having a second voltage amplitude different from the first voltage amplitude;
    a synthesis unit that receives the first and second signals to generate an output signal having different voltage amplitude from the input signal; and
    an input signal discrimination unit that generates the input signal based on an external signal,
    wherein the input signal has substantially a same voltage amplitude as the first voltage amplitude,
    wherein the output signal has substantially a same voltage amplitude as the second voltage amplitude,
    wherein the second voltage amplitude is smaller than the first voltage amplitude,
    wherein the first signal generation unit includes a first logic circuit that is connected between a first power supply line and a third power supply line, and a voltage between the first and third power supply lines corresponds to the first voltage amplitude,
    wherein the input signal discrimination unit includes a second logic circuit that is connected between the first and third power supply lines, and
    wherein the input signal discrimination unit generates the input signal based on a result of comparing a potential of the external signal with a reference potential.

2. A device comprising:
    a first power node supplied with a first power potential;
    a second power node supplied with a second power potential that is different from the first power potential;
    a third power node supplied with a reference potential;
    an input node;
    an output node;
    a first transistor of a first channel type including a source-drain path connected between the first power node and the output node, the first transistor including a gate;
    a second transistor of a second channel type including a source-drain path connected between the third power node and the output node, the second transistor including a gate;
    a third transistor of the first channel type including a source-drain path connected between the second power node and the gate of the first transistor, the third transistor including a gate connected to the input node;
    a fourth transistor of the second channel type including a source-drain path connected between the third power node and the gate of the first transistor, the fourth transistor including a gate connected to the input node;
    a fifth transistor of the first channel type including a source-drain path connected between the first power node and the gate of the second transistor, the fifth transistor including a gate connected to the input node; and
    a sixth transistor of the second channel type including a source-drain path connected between the third power node and the gate of the second transistor, the sixth transistor including a gate connected to the input node.

3. The device as claimed in claim 2, wherein a voltage difference between the first power potential and the reference potential is smaller than a voltage difference between the second power potential and the reference potential.

4. The device as claimed in claim 2, wherein the first channel type is a P-channel type and the second channel type is an N-channel type.

5. The device as claimed in claim 2, wherein the input node receives an input signal that changes between the second power potential and the reference potential.

6. The device as claimed in claim 2, wherein the first transistor is turned ON by the gate and source thereof receiving the reference potential and the second power potential, respectively, in response to the third and fourth transistors being rendered non-conductive and conductive, respectively, and the second transistor is turned ON by the gate and source thereof receiving the first power potential and the reference potential, respectively, in response to the fifth and sixth transistors being rendered conductive and non-conductive, respectively.

7. The device as claimed in claim 6, wherein the third and fourth transistors are rendered non-conductive and conductive, respectively, when the input node takes the second power potential, and the fifth and sixth transistors are rendered conductive and non-conductive, respectively, when the input node takes the reference potential.

8. The device as claimed in claim 2, wherein the second power potential is greater with reference to the reference potential than the first power potential, and the first and second channel types are P-channel and N-channel types, respectively, the input signal receiving an input signal that changes between the second power potential and the reference potential.

9. A device comprising:
first and second power nodes supplied with first and second power potentials that are different from each other;
a third power node supplied with a reference potential;
input and output nodes;
a first transistor of a first channel type connected between the first power node and the output node and including a gate;
a second transistor of a second channel type connected between the third power node and the output node and including a gate;
a first inverter connected between the second and third power nodes to operate on a first voltage difference between the second power potential and the reference potential; the first inverter including an input end connected to the input node and an output end connected to the gate of the first transistor; and
a second inverter connected between the first and third power nodes to operate on a second voltage difference between the first power potential and the reference potential; the second inverter including an input end connected to the input node and an output end connected to the gate of the second transistor.

10. The device as claimed in claim 9, the first inverter produces at its output end the reference potential to render the first transistor conductive when the input node takes the second power potential, and the second inverter produces at its output end the first power potential to render the second transistor conductive when the input node takes the reference potential, each of the first and second transistors being supplied, when rendered conductive, with the second voltage difference between the gate and source thereof.

* * * * *